United States Patent [19]

Yamazaki et al.

[11] Patent Number: 4,913,763
[45] Date of Patent: Apr. 3, 1990

[54] DIE BONDING APPARATUS

[75] Inventors: Nobuto Yamazaki, Tachikawa;
Minoru Kawagishi, Kokubunji, both of Japan

[73] Assignee: Kabushiki Kaisha Shinkawa, Tokyo, Japan

[21] Appl. No.: 289,233

[22] Filed: Dec. 22, 1988

[30] Foreign Application Priority Data

Dec. 23, 1987 [JP] Japan ................. 62-325728

[51] Int. Cl.⁴ ................. B03B 15/20; B03B 15/22
[52] U.S. Cl. ................. 156/358; 100/50; 100/256; 100/257; 156/497; 156/580
[58] Field of Search ............... 156/351, 358, 359, 497, 156/580, 583.1, 583.6; 100/256, 257, 93 P, 50, 51, 268

[56] References Cited

U.S. PATENT DOCUMENTS

| | | | |
|---|---|---|---|
| 1,563,684 | 12/1925 | Black | 100/50 |
| 3,041,963 | 7/1962 | Hazelton et al. | 100/256 |
| 3,841,140 | 10/1974 | Hryc | 100/256 |
| 4,640,732 | 2/1987 | Stafford | 156/358 |
| 4,725,327 | 2/1988 | Matuda et al. | 156/351 |
| 4,749,435 | 6/1988 | Kogane et al. | 156/583.1 |

*Primary Examiner*—Michael Wityshyn
*Attorney, Agent, or Firm*—Koda & Androlia

[57] ABSTRACT

A die bonding apparatus including a vertically moving block, a collet holder provided on the vertically moving block such that the collet holder itself freely moves up and down, a collet which holds a die to be bonded to a substrate and is installed in the collet holder, a first contact provided on the vertically moving block, and a second contact provided on the collet holder so that the second contact is pressed by a spring to make contact with the upper surface of the first contact. The position where rapid downward movement of the collet is stopped and the bonding load applied to the substrate are decided based upon a signal which is generated upon separation of the two contacts.

1 Claim, 1 Drawing Sheet

DIE BONDING APPARATUS

BACKGROUND OF THE INVENTION

1. Field of the Invention

The present invention relates to a die bonding apparatus which is used to bond dies to a substrate, etc.

2. Prior Art

In conventional die bonding apparatuses, a collet is simply raised and lowered by a raising and lowering mechanism. Accordingly, adjustment of the height of the collet must be performed by lowering the collet while observing the gap between the substrate and the collet with a microscope.

An example of this type of apparatus is described in Japanese Patent Application Laid-Open No. 52-65675.

In this prior art apparatus, the height of the collet is adjusted visually. Accordingly, it requires skill and a considerable amount of time to adjust. Furthermore, since the position where the die adhered to the collet by suction cannot be quantitatively judged, the collet must be lowered at a slower rate. Accordingly, the production characteristics of the apparatus are poor. Furthermore, it is difficult to alter the bonding load which presses the die against the substrate in accordance with the type of die and type of substrate involved.

SUMMARY OF THE INVENTION

Accordingly, one object of the present invention is to provide a die bonding apparatus which allows quick and easy adjustment of the height of the collet.

Another object of the present invention is to provide a die bonding apparatus which allows rapid lowering of the collet to a fixed position above the substrate.

Still another object of the present invention is to provide a die bonding apparatus in which the bonding load can be easily and arbitrarily altered.

The problems encountered in the prior art are solved by the unique structure of this invention wherein a vertically moving block is driven upward and downward, and a collet holder provided on the vertically moving block is also freely moved upward and downward. A collet which holds a die by vacuum suction is installed in the collet holder, and a contact is provided on the vertically moving block. Another contact is provided on the collet holder so that this contact touches the upper surface of the contact of the vertically moving block. A means for applying force so that the two contacts are pressed against each other is also provided.

Since the contact on the collet holder contacts the upper surface of the contact on the vertically moving block, the collet holder and the collet both move up and down in accordance with the upward and downward motion of the vertically moving block. Accordingly, when the vertically moving block is lowered, the die adhering to the collet by suction contacts a substrate so that lowering of the collet holder is stopped. However, since the vertically moving block is designed so that it can be lowered even further, when the vertically moving block is thus lowered further, the two contacts are separated from each other. As a result, the position at which the die contacts the substrate is detected, and the position, which is a fixed position above the substrate to which the vertically moving block can be lowered at a rapid rate, can be easily set via a detection signal generated by the separation of the two contacts as a standard. Furthermore, the force pressing the two contacts against each other varies depending upon the amount that the vertically moving block is further lowered, which is decided by the signal generated by the separation of the contacts as a standard. Accordingly, the bonding load can be easily and arbitrarily adjusted and altered.

BRIEF DESCRIPTION OF THE DRAWINGS

The attached drawings illustrate one embodiment of the die bonding apparatus of the present invention, wherein.

DETAILED DESCRIPTION OF THE INVENTION

Figure 1:
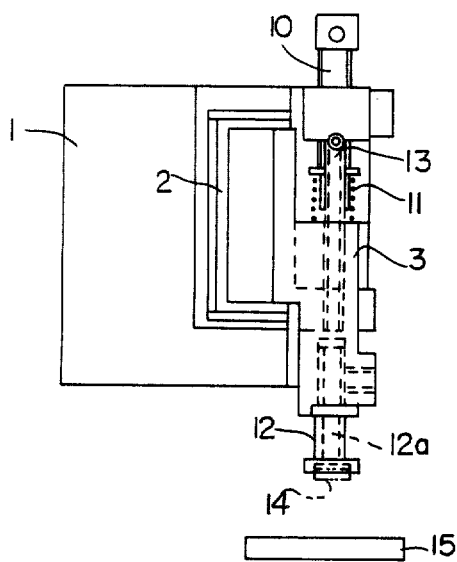
FIG. 1 is a front view of the die bonding apparatus.
Figure 2:
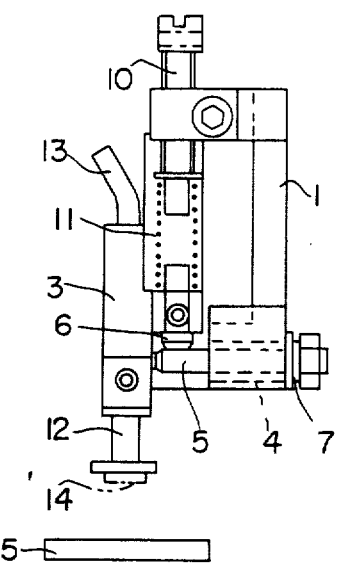
FIG. 2 is a left side view thereof.
Figure 3:
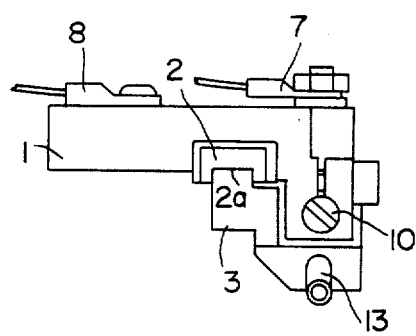
FIG. 3 is a plan view thereof.

A detailed description of an embodiment of the present invention will be given below with reference to the accompanying drawings.

A vertically moving block 1 is mounted on an X-Y table, which is known in prior art and not shown in the Figures, so that the vertically moving block 1 can be moved in the X and Y directions. This vertically moving block 1 is driven upward and downward by a known vertical driving mechanism such as a cam, screw, etc.

A ball slide 2 which has a vertical guide section 2a is fixed to the vertically moving block 1, and a collet holder 3 is installed in this guide section 2a so that the collet holder 3 is free to move upward and downward.

A first contact 5 is provided on the vertically moving block 1 via an insulating bush 4, and a second contact 6 is provided on the collet holder 3 so that the second contact 6 contacts the upper surface of the first contact 5. A first terminal 7 is provided on the first contact 5, and a second terminal 8 is provided on the vertically moving block 1, which is electrically connected to the second contact 6. The second terminal 8 is grounded, and voltage is applied to both terminals 7 and 8 by a means not shown in the Figures. Alternatively, it would also be possible to connect the second terminal 8 to the second contact 6 such that the second terminal 8 is electrically insulated from the vertically moving block 1, and to appy a plus or minus voltage to the terminals 7 and 8.

A load adjusting screw 10 is screwed into a portion of the vertically moving block 1 which is located above the second contact 6. A compression spring 11 is provided in the space between this load adjusting screw 10 and the second contact 6. A collet 12 is provided on the collet holder 3, and a pipe 13 is fastened to the collet holder 3 so that the pipe 13 is connected to the suction-adhesion hole 12a of this collet 12. The pipe 13 is connected to a vacuum pump which is not shown in the Figures.

Next, operation of the apparatus described above will be described.

First, before the bonding operation begins, the height level of the collet 12 is adjusted. With a die 14 adhered to the collet 12 by vacuum suction, the collet 12 is positioned above a substrate 15 which is placed on a substrate table (not shown in the Figures). The vertically moving block 1 is then lowered. Thus, the collet holder 3 and the collet 12 are both lowered. When the die 14 contacts the substrate 15, lowering of the collet 12 and collet holder 3 is stopped. However, the vertically moving block 1 can be lowered even further because of the space between the screw 10 and the second contact 6 and of the spring 11 provided between these two elements. Thus, when the vertically moving block 1 is lowered further, the contacts 5 and 6 are separated from each other. A signal which is generated by separation of the contacts 5 and 6 is stored in an arithmetic unit not shown in the Figures. Thus, by using the detection signal generated by the separation of the contacts 5 and 6 as a standard, the position at which rapid lowering of the collet 12 is stopped can be set, and the bonding load (i. e., the amount to which the vertically moving block 1 is further lowered) can also be set.

The position at which rapid lowering of the collet 12 is stopped is decided as follows: If, for example, such a position where the collet 12 is lowered and the die 14 is 0.1 mm above the substrate 15, the position of the vertically moving block 1 where the die 14 is positioned 0.1 mm above the substrate is stored in the arithmetic unit using the detection signal generated by separation of the contacts 5 and 6 as a standard.

As to the bonding load, it is true that when the vertically moving block 1 is lowered further after the die 14 has contacted the substrate 15, the pressure applied to the compression spring 11 varies depending upon how much further the vertically moving block 1 is lowered; thus, the force with which the die 14 is pressed against the substrate 15 also varies. Accordingly, the amount that the vertically moving block 1 is further lowered can be empirically set in accordance with the materials and sizes, etc., of the die 14 and substrate 15 by using the signal generated by separation of the contacts 5 and 6 as a standard.

The bonding action of the apparatus described above is executed as follows:

The collet 12 first picks up the die 14 by suction at a die pick-up position not shown in the Figures. The vertically moving block 1 is then moved in the X and Y directions so that the collet 12 is positioned above the substrate 15.

The vertically moving block 1 is then lowered at a rapid rate, and when the die 14 reaches the position 0.1 mm above the substrate 15, the vertically moving block 1 is lowered at a slow rate in accordance with a command from the arithmetic unit.

Then, when the vertically moving block 1 is lowered further after the die 14 has contacted the substrate 15, the contacts 5 and 6 are separated from each other so that the detection signal is output. With this detection signal, the vertically moving block 1 is lowered by a predetermined amount using the detection signal as a standard. As a result, the die 14 is pressed against the substrate 15 under a predetermined bonding load and is thus bonded thereto. Afterward, the vertically moving block 1 is raised.

As is clear from the above description, the present invention allows the position at which the die contacts the substrate to be easily ascertained by means of a signal which is generated when the contact of the collet holder and another contact of the vertically moving block are separated from each other. Furthermore, the collet can be lowered at a rapid rate to a fixed position above the substrate, and the bonding load can be easily and arbitrarily altered.

We claim:

1. A die bonding apparatus for bonding a die to a substrate characterized in that said apparatus comprises:
    a vertically moving block which is driven upward and downward;
    a collet holder provided on said vertically moving block such that said collet holder is free to move upward and downward relative to said vertically moving block;
    a collet which is installed in said collet holder;
    a vacuum suction means provided on said collet for holding said die on said collet;
    a first contact provided on said vertically moving block;
    a second contact provided on said collet holder so that said second contact is contactable with an upper surface of said first contact provided on said vertically moving block; and
    a means for pressing said two contacts against each other when said die is not in contact with said substrate;
    whereby when said die contacts said substrate, said first and second contacts separate from each other and a rate of downward movement of said collet is switched from a rapid rate to a slow rate in response to said separation.

* * * * *

UNITED STATES PATENT AND TRADEMARK OFFICE
CERTIFICATE OF CORRECTION

PATENT NO. : 4,913,763

DATED : APRIL 3, 1990

INVENTOR(S) : NOBUTO YAMAZAKI et al.

It is certified that error appears in the above-identified patent and that said Letters Patent is hereby corrected as shown below:

Title page:

Item (75) Inventors: Change "Nobuto Yamazaki, Tachikawa; Minoru Kawagishi, Kokubunji, both of Japan" to --Nobuto Yamazaki, Minoru Kawagishi, and Shigeru Fuke, all of Tokyo, Japan--

Signed and Sealed this

Thirtieth Day of July, 1991

Attest:

HARRY F. MANBECK, JR.

*Attesting Officer*  *Commissioner of Patents and Trademarks*